United States Patent
Chicher

(10) Patent No.: US 9,311,235 B2
(45) Date of Patent: Apr. 12, 2016

(54) METHOD OF ERASING INFORMATION STORED IN A NONVOLATILE REWRITABLE MEMORY, STORAGE MEDIUM AND MOTOR VEHICLE COMPUTER

(71) Applicants: CONTINENTAL AUTOMOTIVE FRANCE, Toulouse (FR); CONTINENTAL AUTOMOTIVE GMBH, Hannover (DE)

(72) Inventor: Arnaud Chicher, Toulouse (FR)

(73) Assignees: CONTINENTAL AUTOMOTIVE FRANCE, Toulouse (FR); CONTINENTAL AUTOMOTIVE GMBH, Hannover (DE)

(*) Notice: Subject to any disclaimer, the term of this patent is extended or adjusted under 35 U.S.C. 154(b) by 25 days.

(21) Appl. No.: 14/346,070

(22) PCT Filed: Sep. 28, 2012

(86) PCT No.: PCT/EP2012/004070
§ 371 (c)(1),
(2) Date: Mar. 20, 2014

(87) PCT Pub. No.: WO2013/045101
PCT Pub. Date: Apr. 4, 2013

(65) Prior Publication Data
US 2014/0244919 A1 Aug. 28, 2014

(30) Foreign Application Priority Data

Sep. 29, 2011 (FR) .................................. 11 02955

(51) Int. Cl.
*G06F 13/00* (2006.01)
*G06F 12/02* (2006.01)
*G11C 16/14* (2006.01)
*G11C 16/16* (2006.01)
*G06F 12/06* (2006.01)

(52) U.S. Cl.
CPC ............ *G06F 12/0246* (2013.01); *G11C 16/14* (2013.01); *G11C 16/16* (2013.01); *G06F 12/0607* (2013.01); *G06F 2212/7205* (2013.01); *G06F 2212/7206* (2013.01)

(58) Field of Classification Search
None
See application file for complete search history.

(56) References Cited

U.S. PATENT DOCUMENTS 8,838,875 B2 * 9/2014 Park ............................. 711/103
2007/0113030 A1 5/2007 Bennett et al.

FOREIGN PATENT DOCUMENTS

EP 1 739 683 A1 1/2007

OTHER PUBLICATIONS

International Search Report, dated Dec. 12, 2012, from corresponding PCT application.

*Primary Examiner* — Idriss N Alrobaye
*Assistant Examiner* — Richard B Franklin
(74) *Attorney, Agent, or Firm* — Young & Thompson

(57) ABSTRACT

Method of erasing information stored in a nonvolatile rewritable memory of a computer, wherein a master module sends erasing requests to a slave module of the computer, the memory including at least two interleaved sectors. The method includes preliminary steps of determining a virtual memory addressing space associated with the memory, in which each sector extends over a specific range of consecutive virtual memory addresses, and establishing a first correspondence function for determining, from a range of virtual memory addresses, the sector or sectors whose contents must be erased, and for each erasing request received by the slave module indicating a range of virtual memory addresses, a step of determining the sector or sectors whose contents must be erased by the slave module. The memory includes a plurality of segments, each segment breaking down into a plurality of sectors and at least two segments including interleaved physical memory addresses.

8 Claims, 3 Drawing Sheets

METHOD OF ERASING INFORMATION STORED IN A NONVOLATILE REWRITABLE MEMORY, STORAGE MEDIUM AND MOTOR VEHICLE COMPUTER

The present invention belongs to the field of electronic computers, and relates more particularly to a method of erasing information stored in a nonvolatile rewritable memory, an information storage medium, and an electronic computer comprising such a storage medium.

The present invention finds a preferred, although in no way restrictive, application in the case of motor vehicle computers.

BACKGROUND OF THE INVENTION

The electronic computers in motor vehicles take the form in a known way of a microcontroller comprising, in addition to one or more microprocessors, electronic memories (flash, EEPROM ['Electrically-Erasable Programmable Read-Only Memory'], RAM ['Random Access Memory'], etc.), interface devices, etc.

Nonvolatile computer memories store computer programs, or 'software', consisting of a set of program code instructions to be executed by a microprocessor in order to perform the various tasks of said computer. Generally, three main types of software are stored in nonvolatile computer memories:

'Boot Software', as it is known in English, to be executed particularly at the startup of the electronic computer for initializing same, 'Application Software', as it is known in English, to be executed for performing specific tasks of the electronic computer, reprogramming software, or 'Loader Software', as it is known in English, that can be used to modify all or part of the information (in particular the software and/or the calibration data) stored in nonvolatile rewritable memories of the electronic computer.

Boot software and reprogramming software can also be the same software, then known as a 'Boot Loader'.

These days, some electronic computers in motor vehicles are equipped with 'flash memory' type nonvolatile rewritable memories. In a known way a flash memory is generally organized into a plurality of segments on which operations can take place in parallel. Each segment is itself organized into a plurality of sectors, a sector corresponding to the smallest memory unit capable of being made the subject of an erasing operation. In addition, each segment is generally organized into a plurality of pages, a page corresponding to the smallest memory unit capable of being made the subject of a write operation.

For reprogramming a flash memory, in principle the contents of the sectors of the pages in which new information has to be written must be erased, then said new information written in the pages provided.

When the contents of a sector are erased, it is no longer possible to retrieve the information which was previously stored in this sector. It is therefore clear that erasing operations must be performed with caution, in order to ensure that the contents of one or more sectors are not erased by mistake.

FIG. 1 schematically represents the organization of a flash memory comprising two sectors Sa and Sb the physical memory addresses of which are interleaved.

Indeed, it can be seen that the two sectors Sa and Sb break down into a plurality of elements. The elements of said sectors Sa and Sb are arranged so that the flash memory comprises first of all the first element of sector Sa, then the first element of sector Sb, then the second element of sector Sa, then the second element of sector Sb, etc.

Conventionally, erasing requests indicate the physical memory address of the start of the memory area to be erased, as well as the size of the memory area to be erased starting from this physical memory address.

Clearly such an approach implemented for erasing the contents of sector Sa entails a risk of also erasing the contents of sector Sb, due to the fact that these sectors are interleaved.

SUMMARY OF THE INVENTION

The present invention is aimed at providing a solution for reducing the risks of mistakenly erasing sectors, in the case of a nonvolatile rewritable memory of which at least two sectors comprise interleaved physical memory addresses.

The present invention is also aimed at providing a solution which can be used, in some cases, to facilitate the parallel processing of erasing operations and consequently to reduce the duration of erasing the nonvolatile rewritable memory of which the contents must be erased.

In addition, the present invention is aimed at providing a solution for having a slave module, which interacts directly with the nonvolatile rewritable memory and must consequently know the organization and the type thereof, offering an interface to a master module, which sends erasing requests thereto, which is the same whatever the organization and the type of the nonvolatile rewritable memory of which the contents must be erased.

According to a first aspect, the invention relates to a process of erasing information stored in a nonvolatile rewritable memory of an electronic computer, in which a master module sends erasing requests to a slave module of said electronic computer, said nonvolatile rewritable memory being organized into sectors corresponding to the smallest memory unit capable of being made the subject of an erasing operation, at least two sectors comprising interleaved physical memory addresses. In addition, the method of erasing comprises the following preliminary steps:

determining a virtual memory addressing space associated with the nonvolatile rewritable memory, in which each sector extends over a specific range of consecutive virtual memory addresses, establishing a first correspondence function for determining, for each range of virtual memory addresses of the virtual memory addressing space, the sector or sectors associated with a range of virtual memory addresses.

Then, the method of erasing according to the invention comprises, for each erasing request received by the slave module indicating a range of virtual memory addresses, a step of determining, according to the first correspondence function and the range of virtual memory addresses indicated, the sector or sectors of which the contents must be erased by the slave module.

In addition, according to the method of erasing according to the invention, the nonvolatile rewritable memory comprises a plurality of segments, said segments being such that erasing operations on a segment can be carried out simultaneously with erasing operations on another segment, each segment breaking down into a plurality of sectors and at least two segments comprising interleaved physical memory addresses. Each erasing request sent by the master module is further sent indicating a range of virtual memory addresses corresponding only to a single segment of the nonvolatile rewritable memory.

In addition, according to the method of erasing according to the invention, two consecutive erasing requests sent by the master module respectively indicate ranges of virtual memory addresses corresponding to different segments of the nonvolatile rewritable memory, these two consecutive erasing requests being aimed respectively at a first segment and a second segment, the corresponding erasing operations taking place in parallel.

According to particular modes of implementation, the method of erasing comprises one or more of the following characteristics, taken in isolation or according to all the technically possible combinations.

Preferably, the range of virtual memory addresses does not overlap with the range of rewritable physical memory addresses of the nonvolatile rewritable memory, and the method of erasing comprises a step of detecting the use of a range of virtual memory addresses, the step of determining a sector being executed only if a range of virtual memory addresses has been detected.

Preferably, when a plurality of software components is stored in the nonvolatile rewritable memory, the method of erasing comprises:
- a preliminary step of establishing a second correspondence function for determining, for each software component capable of being erased, the range or ranges of virtual memory addresses associated with a software component,
- a step of sending a request to the master module for erasing a software component, by a reprogramming tool connected to the electronic computer,
- a step of the master module Mm converting, according to the second correspondence function, the request for erasing a software component into a request for erasing the range or ranges of virtual memory addresses.

According to a second aspect, the invention relates to an electronic computer information storage medium, storing a slave module suitable for performing operations of erasing the contents of physical memory addresses of a nonvolatile rewritable memory organized into sectors corresponding to the smallest memory unit capable of being made the subject of an erasing operation. In addition, the storage medium stores a first correspondence function for determining, for each range of virtual memory addresses of a predefined virtual memory addressing space, the sector or sectors associated with a range of virtual memory addresses, and the slave module comprises instructions which, when they are executed by said electronic computer, determine, from the first correspondence function and a range of virtual memory addresses indicated in an erasing request received by said slave module, the sector or sectors of which the contents must be erased, the range of virtual memory addresses not overlapping with the range of rewritable physical memory addresses of the nonvolatile rewritable memory, and the slave module being configured for executing the sector-determining instructions according to the first correspondence function only if a range of virtual memory addresses has been detected.

According to particular modes of embodiment, the storage medium comprises one or more of the following characteristics, taken in isolation or according to all the technically possible combinations.

Preferably, the storage medium stores a master module configured for sending erasing requests to the slave module, and a second correspondence function for determining, for each software component stored in the nonvolatile rewritable memory, the range or ranges of virtual memory addresses associated with a software component. In addition, the master module comprises instructions which, when they are executed by the electronic computer, convert, according to the second correspondence function, a request for erasing a software component received by said master module into a request for erasing the range or ranges of virtual memory addresses.

According to a third aspect, the invention relates to an electronic computer which comprises an information storage medium according to any one of the modes of embodiment of the invention.

BRIEF DESCRIPTION OF THE DRAWINGS

The invention will be better understood on reading the following description, given by way of a non-restrictive example, and referring to the figures, in which.

DETAILED DESCRIPTION OF THE PREFERRED EMBODIMENTS

Figure 1:
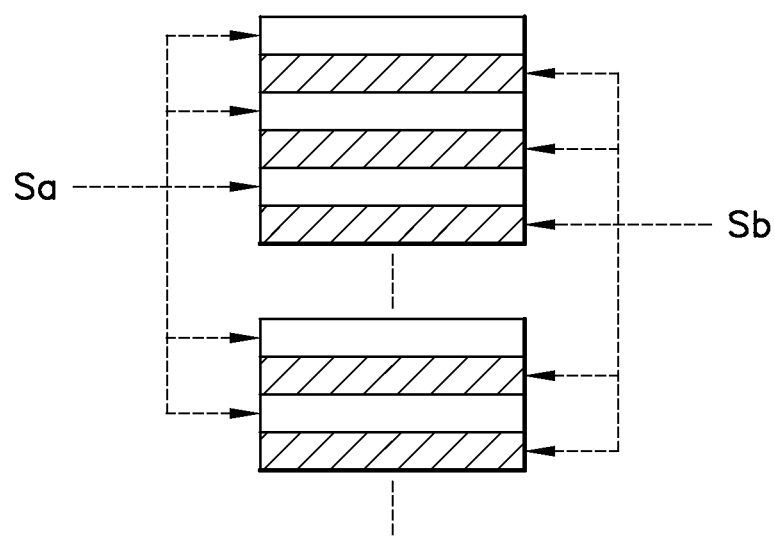
FIG. 1: already cited, is a schematic representation of two interleaved sectors of a flash memory.
Figure 2:
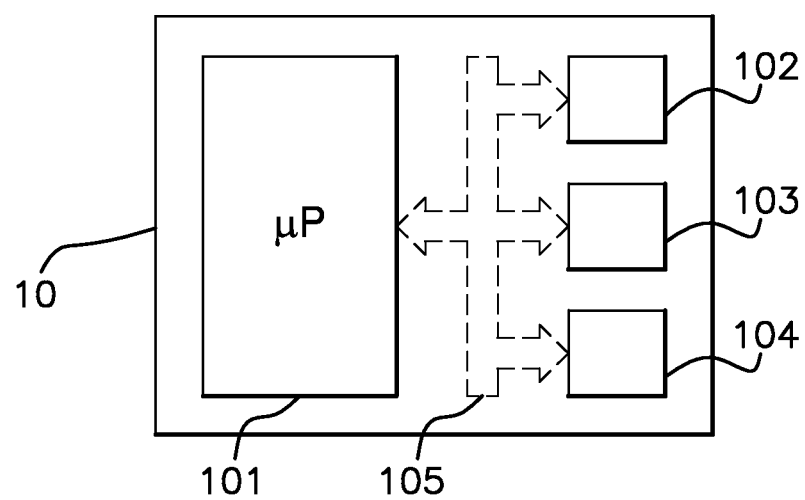
FIG. 2: is a schematic representation of an electronic computer in a motor vehicle.

FIG. 2 very schematically represents an electronic computer 10 in a motor vehicle.

More generally, it should be noted that the invention is applicable to any type of electronic computer that must be reprogrammed by means of an external reprogramming tool 20.

In a known way, the electronic computer 10 comprises a microprocessor 101 connected to electronic memories 102, 103, 104 via a data bus 105.

The electronic computer 10 comprises a nonvolatile rewritable memory 104, in which information capable of being reprogrammed is stored. This information may be program code instructions, or 'software', to be executed for performing the various tasks assigned to said electronic computer, and/or data used by said various software, such as calibration data.

The electronic computer 10 also comprises a nonvolatile memory 103 in which reprogramming software is stored which, when it is executed by the microprocessor 101, is used to reprogram the contents of the nonvolatile rewritable memory 102.

Reprogramming the nonvolatile rewritable memory 102 in principle comprises erasing a memory area of said nonvolatile rewritable memory, then writing new information in this memory area. The remainder of the disclosure primarily relates to erasing operations, with write operations falling outside the framework of the present invention.

According to other modes of embodiment of the electronic computer 10, the nonvolatile rewritable memory 102 and the nonvolatile memory 103 are combined, the reprogramming software then being implemented for reprogramming the contents of the electronic memory in which it itself is stored.

The electronic computer 10 also uses the volatile memory 104 ('RAM' or 'Random Access Memory' designating a direct access memory), in which information is copied temporarily during the operation of the electronic computer 10, with a view to being executed by the microprocessor 101. The nonvolatile rewritable memory 102 is of the type organized into a plurality of sectors. The nonvolatile rewritable memory 102 comprises at least two interleaved sectors. The remainder of the description relates in a non-restrictive way to the case where the nonvolatile rewritable memory 102 is a flash memory.

The present invention relates to a method 50 (see FIGS. 4 and 5) of erasing information stored in the flash memory 102, the implementation of which is ensured in particular, in the present example, by:
- a master module Mm, capable of being integrated into the reprogramming software or into an external reprogramming tool 20,
- a slave module Me integrated into the reprogramming software.

The master module Mm and the slave module Me are software stored, for example, in the nonvolatile memory 103, comprising program code instructions intended to be executed by the microprocessor 101 of the electronic computer 10.

In its principle, the method 50 of erasing is based on the development of a virtual memory addressing space, associating a specific virtual memory address with each physical memory address of the flash memory.

The virtual memory addresses are associated with physical memory addresses so that, in the virtual memory addressing space, each sector of the flash memory 102 extends over a specific range of consecutive virtual memory addresses.

When two sectors are interleaved, i.e. when these sectors comprise interleaved physical memory addresses, there is no range of consecutive physical memory addresses such that:
- all the elements of one of these sectors are included in this range of consecutive physical memory addresses,
- no element of another sector is included in this range of consecutive physical memory addresses.

In the virtual memory addressing space, there is on the contrary, by design, a specific range of consecutive virtual memory addresses for each sector of the flash memory 102 such that:
- all the elements of this sector are included in this range of consecutive virtual memory addresses,
- no element of another sector is included in this range of consecutive virtual memory addresses.

It is therefore clear that it is possible, in the virtual memory addressing space, to unambiguously identify a sector of which the contents must be erased by a range of consecutive virtual memory addresses. In addition, the use of the virtual memory addressing space can be used to issue erasing requests assuming that the sectors of the flash memory 102 are not interleaved.

For this purpose the method 50 of erasing information stored in the flash memory 102 comprises the following preliminary steps:
- 500: determining a virtual memory addressing space in which each sector extends over a specific range of consecutive virtual memory addresses,
- 501: establishing a first correspondence function for determining, for each range of virtual memory addresses of the virtual memory addressing space, the sector or sectors associated with a given range of virtual memory addresses. For erasing the contents of one or more sectors, the master module Mm will send to the slave module Me erasing requests referring to ranges of virtual memory addresses of the flash memory 102.

The method 50 of erasing then comprises, for each erasing request received indicating a range of virtual memory addresses, a step 522 of determining the sector or sectors of which the contents must be erased. During this step, the slave module Me uses the first correspondence function, previously stored, for example, in the nonvolatile memory 103, for determining the sector or sectors associated with the range of virtual memory addresses indicated in the erasing request received.

In a particular mode of implementation, the virtual memory addressing space is such that each segment of the flash memory 102 extends over a specific range of consecutive virtual memory addresses.

As previously described, the segments of a flash memory 102 are such that erasing operations performed on one segment can be performed simultaneously with erasing operations on another segment of the flash memory 102.

Advantageously, the master module Mm is configured so that each erasing request that it issues indicates one or optionally a plurality of ranges of virtual memory addresses which all correspond to the same segment of the flash memory 102. In other words, each erasing request issued by the master module Mm is aimed at only one segment of the flash memory 102. In addition, the master module Mm is configured so that, when erasing operations must be performed on at least two segments of the flash memory 102, erasing requests sent consecutively by the master module Mm are aimed at two different segments.

Such arrangements enable the erasing operations relating to two consecutive erasing requests to be processed in parallel, since said consecutive erasing requests are aimed at two different segments. The duration of erasing will be advantageously reduced due to the fact that numerous erasing operations may be performed substantially simultaneously where, according to the prior art, these erasing operations were performed one after the other since they were performed first for the whole of a first segment, then for the whole of a second segment, etc.

Preferably, the virtual memory addresses have no physical meaning for the flash memory 102. In other words, the range of virtual memory addresses does not overlap with the range of rewritable physical memory addresses of the flash memory 102. Thus, a virtual memory address, if it is interpreted as being a physical memory address of the flash memory 102, does not correspond to a memory address to which information can be written.

The use of a range of virtual memory addresses distinct from the range of rewritable physical memory addresses of the flash memory 102 has the advantage that, at the level of the slave module Me, it will be possible to detect whether or not a range of virtual memory addresses is used, and consequently whether or not the first correspondence function must be used for determining the sector or sectors of which the contents must be erased.

For example, if the flash memory 102 also comprises non-interleaved sectors, erasing these sectors may optionally be done by sending erasing requests directly indicating the ranges of physical memory addresses of these sectors.

Figure 3A:
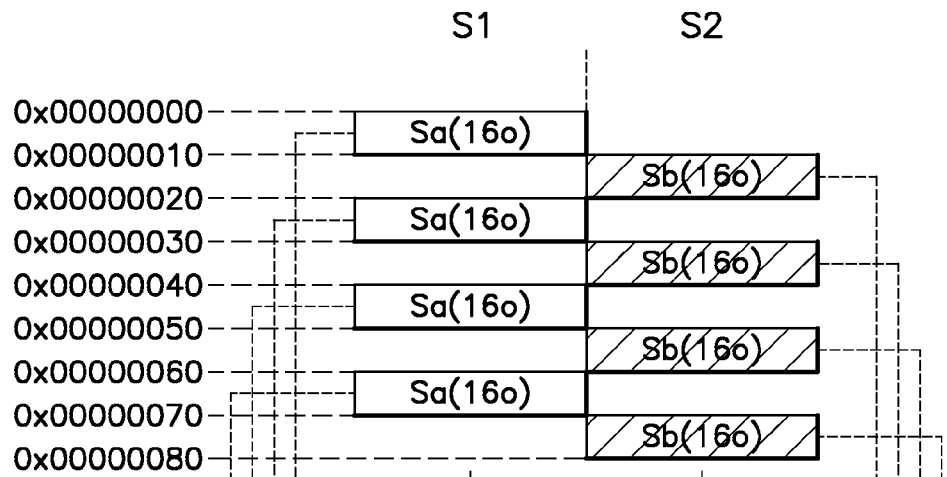
FIGS. 3a and 3b: show an example illustrating the development of a virtual addressing space according to the invention.
Figure 3B:
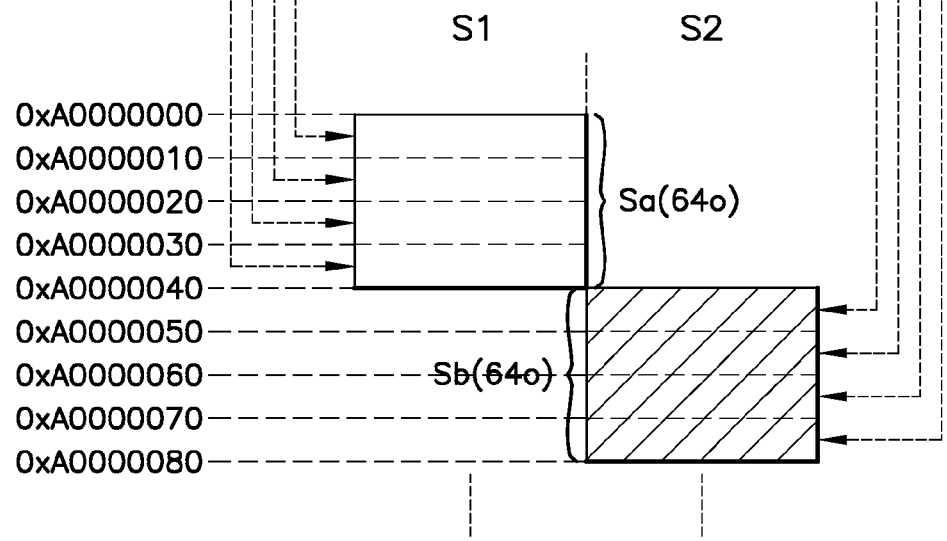

FIGS. 3a and 3b represent one example of determining virtual memory addressing space associated with a flash memory 102.

FIG. 3a schematically represents two segments of the flash memory 102, respectively designated by S1 and S2. Segment S1 comprises one sector Sa and segment S2 comprises one sector Sb.

Sectors Sa and Sb are in addition interleaved. In a non-restrictive manner, it is considered that sectors Sa and Sb each have a memory size of 64 bytes.

As illustrated in FIG. 3a, each sector Sa, Sb breaks down into four elements of 16 bytes in memory size (16 B). The physical memory address 0x00000000 corresponds to the first element of the first sector Sa, the physical memory address 0x00000010 corresponds to the first element of the second sector Sb, the physical memory address 0x00000020 corresponds to the second element of the first sector Sa, the physical memory address 0x00000030 corresponds to the second element of the second sector Sb, etc.

FIG. 3b schematically represents an example of virtual memory addressing space capable of being associated with the flash memory 102.

In this example, the range of virtual memory addresses, associated with the range of physical memory addresses 0x00000000 to 0x0000007F, lies between the virtual memory address 0xA0000000 and the virtual memory address 0xA000007F. This range of virtual memory addresses preferentially does not overlap with the range of rewritable physical memory addresses of the flash memory 102, in order to be able to be easily detected at the level of the slave module Me.

In the example illustrated in FIG. 3b:
the virtual memory address 0xA0000000 is associated with the physical memory address 0x00000000, i.e. with the first element of the first sector Sa,
the virtual memory address 0xA0000010 is associated with the physical memory address 0x00000020, i.e. with the second element of the first sector Sa,
the virtual memory address 0xA0000020 is associated with the physical memory address 0x00000040, i.e. with the third element of the first sector Sa,
the virtual memory address 0xA0000030 is associated with the physical memory address 0x00000060, i.e. with the fourth element of the first sector Sa.

Thus the virtual memory addresses of the range of virtual memory addresses extending from 0xA0000000 to 0xA000003F (virtual memory address starting at 0xA0000000 and memory size of 64 bytes) identify each of the physical memory addresses of said first sector Sa. It is therefore clear that a request for erasing the range of virtual memory addresses 0xA0000000 to 0xA000003F can be interpreted unambiguously as aimed at erasing only the contents of the first sector Sa. In this case, the slave module Me erases the contents of the 16-byte sized elements of physical memory addresses 0x00000000, 0x00000020, 0x00000040 and 0x00000060.

In a similar manner:
the virtual memory address 0xA0000040 is associated with the physical memory address 0x00000010, i.e. with the first element of the second sector Sb,
the virtual memory address 0xA0000050 is associated with the physical memory address 0x00000030, i.e. with the second element of the second sector Sb,
the virtual memory address 0xA0000060 is associated with the physical memory address 0x00000050, i.e. with the third element of the second sector Sb,
the virtual memory address 0xA0000070 is associated with the physical memory address 0x00000070, i.e. with the fourth element of the second sector Sb.

Thus the virtual memory addresses of the range of virtual memory addresses extending from 0xA0000040 to 0xA000007F (virtual memory address starting at 0xA0000040 and memory size of 64 bytes) identify each of the physical memory addresses of the second sector Sb. It is therefore clear that a request for erasing the range of virtual memory addresses 0xA0000040 to 0xA000007F can be interpreted unambiguously as aimed at erasing only the contents of the second sector Sb. In this case, the slave module Me erases the contents of the 16-byte sized elements of physical memory addresses 0x00000010, 0x00000030, 0x00000050 and 0x00000070.

For erasing the contents of both the first sector Sa and the second sector Sb, a first erasing request may indicate the range of virtual memory addresses 0xA0000000 to 0xA000003F while a second erasing request may indicate the range of virtual memory addresses 0xA0000040 to 0xA000007F. Since these two erasing requests are aimed respectively at the first segment S1 and the second segment S2, the corresponding erasing operations may be performed in parallel.

It should be noted that, in the example illustrated in FIGS. 3a and 3b, if the erasing operations need not necessarily be performed in parallel, nothing excludes, for erasing the contents of the first sector Sa and the second sector Sb, sending a single erasing request indicating the range of virtual memory addresses 0xA0000000 to 0xA000007F.

The first correspondence function which will be used by the slave module Me may, for example, be stored in the form of a correspondence table which may then be expressed as follows:

| Range of virtual memory addresses | Sector to be erased |
|---|---|
| 0xA0000000 to 0xA000003F | Sa |
| 0xA0000040 to 0xA000007F | Sb |
| etc. | etc. |

It is clear that other formats are possible for the first correspondence table, and that a particular choice of format constitutes only one variant of implementation of the method 50 of erasing.

Figure 4:
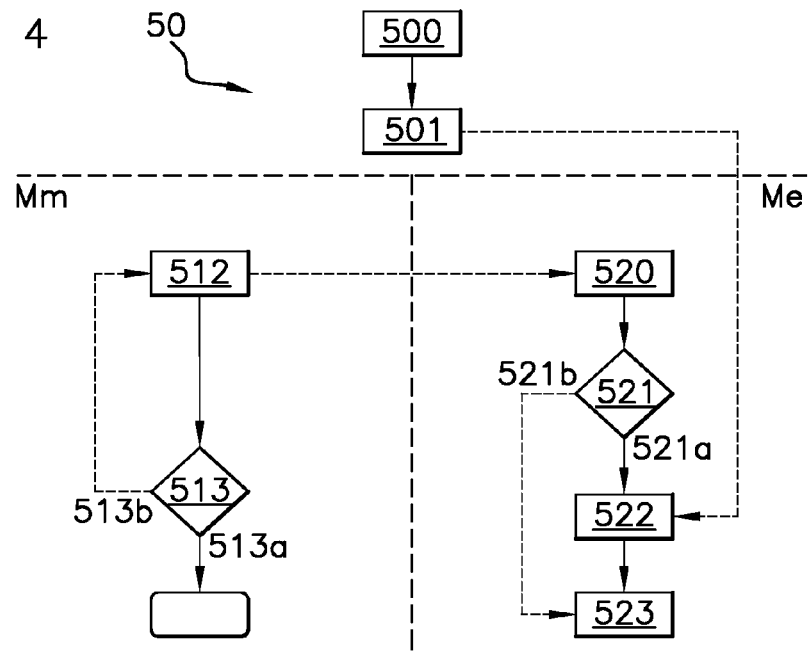
FIG. 4: is a diagram representing the main steps of a preferred mode of implementation of a method of erasing according to the invention.

FIG. 4 schematically represents the main steps of a preferred mode of implementation of the method 50 of erasing.

Preliminary steps 500, 501 of the method 50 of erasing are represented in the upper part of FIG. 4.

For erasing the contents of one or more sectors of the flash memory 102, the method 50 of erasing involves a plurality of steps. The steps represented in the left-hand part of FIG. 4 are executed by the master module Mm, while the steps represented in the right-hand part of FIG. 4 are executed by the slave module Me.

The method 50 of erasing comprises first of all a step 512 of sending an erasing request by the master module Mm. The erasing request indicates one or more ranges of virtual memory addresses.

The method 50 of erasing then comprises a step 520 of receiving the erasing request by the slave module Me.

Preferably, the slave module Me then executes a step 521 of detecting the use of virtual memory address range.

The erasing request having been sent indicating the range or ranges of virtual memory addresses, the slave module Me detects (reference 521a in FIG. 4) that the first correspondence function must be used for determining the sector or sectors of which the contents must be erased.

The method 50 of erasing then comprises step 522 of determining the sector or sectors associated with each of the ranges of virtual memory addresses indicated in the erasing request, according to the first correspondence function.

The method 50 of erasing then comprises a step 523 of erasing the contents of the sector or sectors determined according to the first correspondence function.

Preferably, if the range of virtual memory addresses indicated is erroneous in that it does not encompass one or more complete sectors, the slave module Me will be able to detect it according to the first correspondence function and reject the erasing request (optionally by notifying it to the master module Mm). This step of determining whether the range of virtual memory addresses is correct and, where applicable, this step of rejecting the erasing request are not represented in the figures.

If the erasing request had been sent by the master module indicating a range of physical memory addresses, step 521 of detecting would have determined that the range of memory addresses used was not a range of virtual memory addresses (reference 521b in FIG. 4), leading directly to the execution of step 523 of erasing the contents of the sector or sectors associated with the range of physical memory addresses indicated (e.g. in the case of non-interleaved sectors).

Following the sending of an erasing request, the method 50 of erasing comprises a step 513, executed by the master module Mm, of determining whether other erasing requests must be sent. If no other erasing request must be sent (reference 513a in FIG. 4), the execution of the method 50 of erasing ends.

If other erasing requests must be sent (reference 513b in FIG. 4), step 512 of sending is executed again for sending the next erasing request. The following steps of the method, on the slave module Me side, are then executed again for the new erasing request.

It should be noted that the slave module Me is integrated into the electronic computer 10. The master module Mm can be either integrated into the electronic computer 10, or integrated into a reprogramming tool 20 external to the electronic computer 10 and connected thereto via a communication bus (CAN, Ethernet, etc.).

Figure 5:
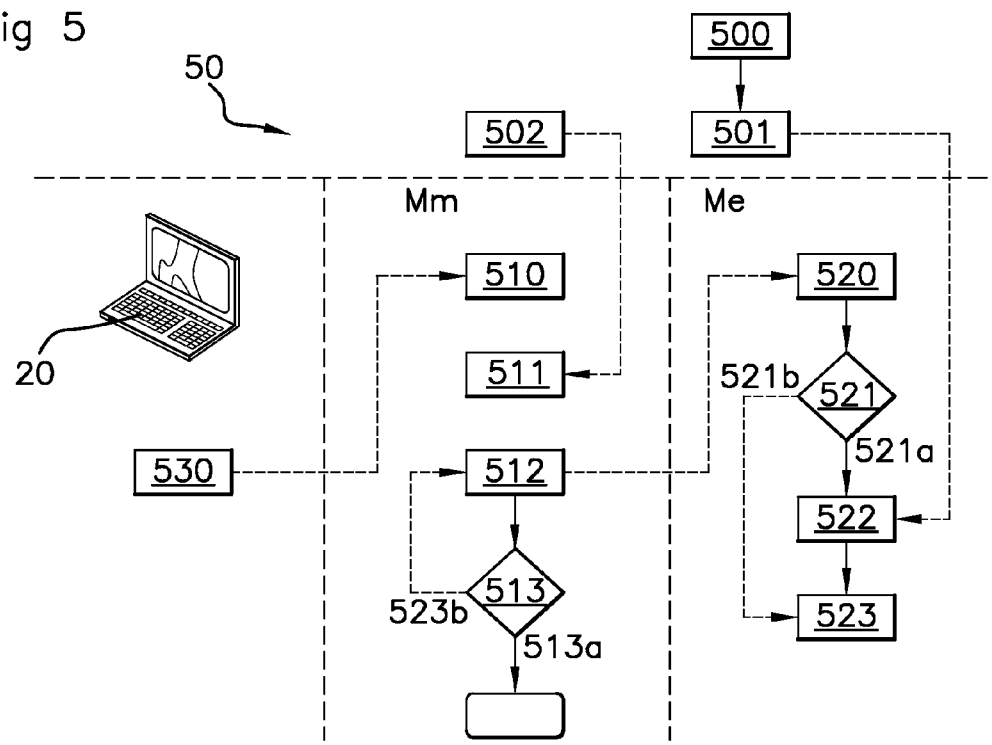
FIG. 5: is a diagram representing the main steps of a preferred variant of the method of erasing in FIG. 4.

FIG. 5 schematically represents the main steps of a preferred variant of implementation of the method 50 of erasing in FIG. 4, in the case where an external reprogramming tool 20 sends erasing requests to the master module Mm integrated into the electronic computer 10.

In this variant of implementation, it is considered that the flash memory 102 stores a plurality of software components which may optionally be erased, and the reprogramming tool 20 sends erasing requests indicating software components to be erased.

This is advantageous since, in this way, the reprogramming tool 20 only needs to know the various software components which can be erased, and does not need to know either the virtual memory addressing space or the organization of the sectors of the flash memory 102.

For this purpose, in addition to all the steps described with reference to FIG. 4, the method 50 of erasing illustrated in FIG. 5 comprises a preliminary step 502 of establishing a second correspondence function for determining, for each software component capable of being erased, the range or ranges of virtual addresses associated with a given software component.

The method 50 of erasing also includes a step 530 of the reprogramming tool 20 sending a request to the master module Mm for erasing a software component.

The method 50 of erasing also comprises a step 510 of the master module Mm receiving the erasing request sent by the reprogramming tool 20.

The method 50 of erasing then comprises a step 511 of the master module Mm converting, according to the second correspondence function, the request for erasing the software component into a request for erasing the range or ranges of virtual memory addresses associated with this software component, which is then sent to the slave module Me during step 512 of sending.

It should be noted that, in the course of step 511 of converting, the master module Mm can convert the request for erasing a software component into one or more erasing requests each indicating one or more ranges of virtual memory addresses.

The present invention also relates to an information storage medium, in this case, the nonvolatile memory 103, in which reprogramming software is stored comprising a slave module Me suitable for implementing the steps of the method 50 of erasing.

Thus the slave module Me comprises program code instructions which, when they are executed by the microprocessor 101, implement in particular steps 520 of receiving, 522 of determining sector or sectors to be erased and 523 of erasing. Where appropriate, the slave module Me also comprises instructions the execution whereof can be used to implement step 521 of detecting.

Where appropriate, the reprogramming software, stored in the storage medium, also comprises a master module Mm suitable for implementing the steps of the method 50 of erasing.

Thus the master module Mm comprises program code instructions which, when they are executed by the microprocessor 101, implement steps 512 of sending an erasing request and 513 of determining whether other erasing requests must be sent. Where appropriate, the master module Mm also comprises instructions the execution whereof can be used to implement steps 510 of receiving and 511 of converting.

The storage medium also stores the first correspondence function and, where appropriate, the second correspondence function.

The present invention also relates to an electronic computer 10 in a motor vehicle comprising a storage medium as described above.

More generally, the scope of the present invention is not limited to the modes of implementation and embodiment described above as non-restrictive examples, but on the contrary extends to all the modifications within the scope of a person skilled in the art.

In particular, it is clear that formats are possible for each of the first and second correspondence functions other than a correspondence table, and that a particular choice of format constitutes only one variant of implementation of the method 50 of erasing. The first correspondence function may in particular take the form of program code instructions to be executed for determining the sector or sectors associated with a range of virtual memory addresses indicated in an erasing request. Similarly, the second correspondence function may take the form of program code instructions to be executed for determining the range or ranges of virtual memory addresses associated with a software component indicated in an erasing request.

The foregoing description clearly illustrates that through its various characteristics and their advantages, the present invention achieves the objectives that were set.

In particular, due to the use of a virtual memory addressing space in which the sectors of the flash memory 102 are not interleaved, the sectors to be erased can be unambiguously identified, limiting the risks of mistakenly erasing one or more sectors.

The invention claimed is:

1. A method (50) of erasing information stored in a nonvolatile rewritable memory (102) of an electronic computer (10), in which a master module (Mm) sends erasing requests to a slave module (Me) of said electronic computer (10), said nonvolatile rewritable memory (102) being organized into sectors (Sa, Sb) corresponding to the smallest memory unit capable of being made the subject of an erasing operation, at least two sectors comprising interleaved physical memory addresses, said method comprising the following preliminary steps:

determining a virtual memory addressing space associated with the sectors of the nonvolatile rewritable memory (102), in which each sector extends over a specific range of consecutive virtual memory addresses; and establishing a first correspondence function that determines, for any given range of virtual memory addresses, one or more of said sectors that are associated with said given range of virtual memory addresses, wherein, following said preliminary steps the method (50) of erasing comprises:

for each erasing request received by the slave module (Me) indicating a range of virtual memory addresses to be erased, a step is carried out of determining, according to said first correspondence function and the indicated range of virtual memory addresses, one or more corresponding sectors of the non-volatile memory to be erased by the slave module (Me), wherein the nonvolatile rewritable memory comprises a plurality of segments (S1, S2), each segment breaking down into a plurality of sectors and at least two segments comprising interleaved physical memory addresses, wherein each erasing request sent by the master module (Mm) is sent indicating a range of virtual memory addresses corresponding only to a single segment (S1, S2) of the nonvolatile rewritable memory (102), and wherein two consecutive erasing requests sent by the master module (Mm) respectively indicate ranges of virtual memory addresses corresponding to different segments of the nonvolatile rewritable memory (102), said two consecutive erasing requests being aimed respectively at a first segment (S1) and a second segment (S2), erasing operations for said first and second segments (S1,S2) corresponding to said two consecutive erasing requests taking place in parallel.

2. The method (50) according to claim 1, wherein the range of virtual memory addresses does not overlap with any range of rewritable physical memory addresses of the nonvolatile rewritable memory (102), and wherein the method comprises a step (521) of detecting whether a range of memory addresses provided with a received erasing request is a range of virtual memory addresses, the step (522) of determining a sector being executed only if the provided range of memory addresses are virtual memory addresses.

3. The method (50) according to claim 2, wherein, a plurality of software components being stored in the nonvolatile rewritable memory (102), and said method further comprises:

a preliminary step (502) of establishing a second correspondence function that determines, for any given software component that is capable of being erased, one or more ranges of virtual memory addresses associated with said given software component, a step (530) of sending a request to the master module (Mm) that identifies a software component to be erased, by a reprogramming tool (20) connected to the electronic computer, a step (511) of the master module (Mm) converting, according to the second correspondence function, the request for erasing the software component to be erased into a request for erasing one or more ranges of virtual memory addresses associated with the software component to be erased.

4. A device comprising an electronic computer, configured to be used in a motor vehicle, comprising a physical storage memory having stored therein software code sufficient for causing a processing device of the electronic computer, upon execution by the processing device, to carry out the method according to claim 3.

5. A device comprising an electronic computer, configured to be used in a motor vehicle, comprising a physical storage memory having stored therein software code sufficient for causing a processing device of the electronic computer, upon execution by the processing device, to carry out the method according to claim 2.

6. The method (50) according to claim 1, wherein, a plurality of software components being stored in the nonvolatile rewritable memory (102), and said method further comprises:

a preliminary step (502) of establishing a second correspondence function that determines, for any given software component that is capable of being erased, one or more ranges of virtual memory addresses associated with said given software component, a step (530) of sending a request to the master module (Mm) that identifies a software component to be erased, by a reprogramming tool (20) connected to the electronic computer, a step (511) of the master module (Mm) converting, according to the second correspondence function, the request for erasing the software component to be erased into a request for erasing one or more ranges of virtual memory addresses associated with the software component to be erased.

7. A device comprising an electronic computer, configured to be used in a motor vehicle, comprising a physical storage memory having stored therein software code sufficient for causing a processing device of the electronic computer, upon execution by the processing device, to carry out the method according to claim 6.

8. A device comprising an electronic computer, configured to be used in a motor vehicle, comprising a physical storage memory having stored therein software code sufficient for causing a processing device of the electronic computer, upon execution by the processing device, to carry out the method according to claim 1.

* * * * *